(12) United States Patent
Zhong et al.

(10) Patent No.: US 7,804,706 B2
(45) Date of Patent: Sep. 28, 2010

(54) BOTTOM ELECTRODE MASK DESIGN FOR ULTRA-THIN INTERLAYER DIELECTRIC APPROACH IN MRAM DEVICE FABRICATION

(75) Inventors: Tom Zhong, Saratoga, CA (US); Chyu-Jiuh Torng, Pleasanton, CA (US); Rongfu Xiao, Fremont, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 150 days.

(21) Appl. No.: 12/313,117

(22) Filed: Nov. 17, 2008

(65) Prior Publication Data

US 2010/0123207 A1      May 20, 2010

(51) Int. Cl.
   *G11C 11/00* (2006.01)
(52) U.S. Cl. .................... 365/158; 257/421; 438/3; 977/935
(58) Field of Classification Search .................. 365/148, 365/158, 171, 173; 257/421; 438/3; 977/933–935
   See application file for complete search history.

(56) References Cited

U.S. PATENT DOCUMENTS

| 6,358,755 | B1 | 3/2002 | Evans |
| 7,122,386 | B1 | 10/2006 | Torng et al. |
| 2003/0210586 | A1* | 11/2003 | Nakajima et al. ........... 365/200 |
| 2004/0056289 | A1* | 3/2004 | Ooishi ........................ 257/295 |
| 2004/0169214 | A1* | 9/2004 | Nakajima et al. ........... 257/295 |
| 2006/0172439 | A1* | 8/2006 | Leuschner ..................... 438/3 |
| 2008/0225576 | A1 | 9/2008 | Zhong et al. |

* cited by examiner

*Primary Examiner*—Richard Elms
*Assistant Examiner*—Harry W Byrne
(74) *Attorney, Agent, or Firm*—Saile Ackerman LLC; Stephen B. Ackerman (57) ABSTRACT

A bottom electrode (BE) layout is disclosed that has four distinct sections repeated in a plurality of device blocks and is used to pattern a BE layer in a MRAM. A device section includes BE shapes and dummy BE shapes with essentially the same shape and size and covering a substantial portion of substrate. There is a via in a plurality of dummy BE shapes where each via will be aligned over a WL pad. A second bonding pad section comprises an opaque region having a plurality of vias. The remaining two sections relate to open field regions in the MRAM. The third section has a plurality of dummy BE shapes with a first area size. The fourth section has a plurality of dummy BE shapes with a second area size greater than the first area size to provide more complete BE coverage of an underlying etch stop ILD layer.

20 Claims, 7 Drawing Sheets

BOTTOM ELECTRODE MASK DESIGN FOR ULTRA-THIN INTERLAYER DIELECTRIC APPROACH IN MRAM DEVICE FABRICATION

RELATED PATENT APPLICATION

This application is related to the following: Ser. No. 11/724,435, filing date Mar. 15, 2007; assigned to a common assignee and herein incorporated by reference in its entirety.

FIELD OF THE INVENTION

The invention relates to an improved bottom electrode mask layout to achieve more uniform interlayer dielectric (ILD) layer thickness and reduce ILD delamination during an MRAM device fabrication.

BACKGROUND OF THE INVENTION

Magnetic random access memory (MRAM) that incorporates a magnetic tunnel junction (MTJ) as a memory storage device is a strong candidate to provide a high density, fast (1-30 ns read/write speed), low power, and non-volatile solution for future memory applications. The architecture for MRAM devices is composed of an array of memory cells generally arranged in rows and columns. Each memory cell is comprised of a memory element (MTJ) that is in electrical communication with a transistor through an interconnect stack. The memory elements are programmed by a magnetic field created from pulse current carrying conductors such as copper lines. Typically, two arrays of current carrying conductors that may be called "word lines" and "bit lines" are arranged in a cross point matrix. Normally, the word lines are formed under the MTJs and are isolated from the memory elements by one or more layers such as an etch stop layer and an interdielectric (ILD) layer. The bit lines contact the top portion of the MTJs and are electrically connected to a conductive cap layer. Additionally, there is a bottom electrode (BE) that contacts the bottom of each MTJ and electrically connects the MTJ with an underlying transistor.

The MTJ consists of a stack of layers with a configuration in which two ferromagnetic layers are separated by a thin insulating layer such as $AlO_X$ that is called a tunnel barrier layer. One of the ferromagnetic layers is a pinned layer in which the magnetization (magnetic moment) direction is more or less uniform along a preset direction and is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through a bit line and word line in a write operation. When the magnetization direction of the free layer is parallel to that of the pinned layer, there is a lower resistance for tunneling current across the insulating layer (tunnel barrier) than when the magnetization directions of the free and pinned layers are anti-parallel. The MTJ stores digital information ("0" and "1") as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents. Cells which are selectively written to are subject to magnetic fields from both a bit line and word line while adjacent cells (half-selected cells) are only exposed to a bit line or a word line field.

As the MTJ size from a top-down view shrinks relative to the easy axis and hard axis directions (x,y plane), and from a cross-sectional perspective is reduced in thickness (perpendicular to the x,y plane) in order to satisfy higher performance MRAM requirements, the interconnects within the MRAM structure also decrease in size to conform to electrical requirements and space restrictions for high density designs. There is also a greater demand on reliability of the MRAM device since reduced MTJ sizes usually lead to a greater chance of device failure at contact points between adjacent metal layers and tend to cause delamination of the one or more interlevel dielectric (ILD) layers that separate the bit line and word line during CMP processing. In particular, the ILD layer above the word line and below the MTJ tends to delaminate during CMP processes to planarize the MTJ and bit line (BIT).

In order to maximize word line and bit line writing efficiency in an MRAM device, one needs to minimize both the distance from the bit line (BIT) to the MTJ free layer and the distance from the word line (WL) to the MTJ free layer. In related patent application Ser. No. 11/724,435, a MTJ mask layout was described that enables a reduction in the BIT-MTJ distance. In state of the art MRAM designs, there are only BE and ILD layers separating the WL and MTJ. The BE thickness is normally thin so the best approach to minimize the WL-MTJ distance is to reduce the ILD thickness. However, there are some major obstacles in this approach. First, there is a lack of high etch selectivity between BE films and ILD films. Secondly, an over-etch non-uniformity across a substrate due to etch tool hardware limitations and an etch micro-loading effect between dense and isolated features prevents a smooth and thin ILD layer. Moreover, as an ILD layer becomes thinner, it is more susceptible to delamination during chemical mechanical polish (CMP) processes. In addition, as an ILD layer becomes thinner, the risk of etch chemical leakage through pinholes and attacking the WL increases. Therefore, an improved BE mask layout is required to enable thinner ILD layers without suffering from the aforementioned drawbacks.

A routine search of the prior art revealed the following reference. In U.S. Pat. No. 6,358,755, a dummy bottom electrode may be formed in addition to a bottom electrode in a memory cell where a metal plug and bottom electrode form an electrical connection between a ferroelectric capacitor and an integrated circuit transistor. However, the circuit does not include a MTJ as required for a MRAM device fabrication.

SUMMARY OF THE INVENTION

One objective of the present invention is to provide a BE pattern layout in a MRAM device that minimizes delamination of dielectric layers between the word line and MTJ especially during CMP processing of various dielectric layers.

A second objective of the present invention is to provide a BE pattern layout according to the first objective that also provides improved etch thickness uniformity with fewer defects in the ILD layer contacting the word line thereby minimizing WL corrosion.

According to the present invention, these objectives are achieved by providing a substructure for a MRAM array that includes metal layers, insulating layers, and transistors arranged in a conventional configuration on a semiconductor substrate. In the exemplary embodiment, the substructure includes a word line metal layer comprised of a plurality of word line pads (WLP), word line contacts (WLC), and word lines (WL) which may be made of Cu and is coplanar with a WL ILD layer. A first etch stop layer (etch stop ILD) such as SiNx or the like is deposited on the WL ILD layer and WL metal layer. The etch stop ILD layer may be patterned and etched to form openings over certain portions of the underlying layers.

In one embodiment, a bottom electrode (BE) layer is deposited on the etch stop ILD layer. A BE mask with a unique design (pattern layout) is used to pattern the BE layer in a subsequent lithography step. The BE mask is comprised of a clear quartz substrate covered on one of its two large surfaces with an array of opaque features having the same shape and pattern as the intended array of BE elements in the final device. Clear regions between the opaque features will be transferred into the BE layer by a sequence involving photolithography and etching steps. A photoresist film is coated on the BE layer and is exposed by one or more wavelengths of light through the clear regions in the BE mask. Following exposure, the exposed regions of the photoresist film are removed by an aqueous base developer. Subsequently, a reactive ion etch (RIE) may be employed to transfer the openings in the photoresist film through underlying regions in the BE layer and stopping on the etch stop ILD layer. After the RIE step is complete, the remaining photoresist film is removed to afford a patterned BE layer having a plurality of BE elements.

A key feature of the present invention is the BE layout or array of opaque features on the BE mask that will be employed to form BE elements in a MRAM array on a substrate. The BE mask layout is comprised of opaque chrome features on a clear quartz substrate and includes at least four sections that are repeated a plurality of times across the BE mask. In a first section called the device area, there is a plurality of opaque features that will become active BE elements in the patterned BE layer of the MRAM cell. For example, there are 4 million active BE elements (and the same number of active MTJ elements) in each device block in a 4 Mb MRAM. A plurality of dummy BE shapes is positioned to cover a substantial portion of the clear quartz regions between active BE shapes in adjoining device blocks. In one embodiment, the shapes of the active BE and dummy BE features are essentially equivalent and the space between any two adjacent BE features in the BE array is maintained at a constant value across the device area. In one aspect, each clear space between adjacent BE features has a dimension "s" that is substantially less than the length of an adjoining side of a neighboring BE shape which is a rectangle in the exemplary embodiment. A certain number of the dummy BE shapes have a via opening formed therein to enable BIT line contact to WL pad in a subsequent MRAM fabrication step.

In a second section of the BE mask called the bond pads area, the opaque covering on the mask is essentially continuous except for a plurality of small via openings that enable a BIT line contact to bonding pad in a subsequent MRAM fabrication step.

There is a third BE mask section that is an open field area which is not overlaid on a WL metal pattern. This open field area is comprised of an array of opaque features such as rectangles each having a length "b" and a width "c" and separated by clear regions with a dimension "a" between opaque rectangles. Preferably, a>c but "a" may also be equal to or less than "c". The opaque features will be transferred into the BE layer to become dummy BE elements to assist in achieving improved BE ILD uniformity in a subsequent CMP process. In one aspect, the density of the dummy BE elements is essentially the same as the density of the dummy MTJ elements to be formed in a MTJ patterning sequence during a later stage of MRAM fabrication.

A fourth section of the BE mask is an open field area that will be overlaid above a WL metal pattern. In one embodiment, this section has an array of opaque rectangles similar to the third section except the rectangles are larger and cover a majority of the clear substrate. The opaque shapes in the fourth section will be transformed by a photolithography and etching process into dummy BE elements in the MRAM device. Preferably, the clear opening between short sides of adjacent rectangles and between long sides of adjacent rectangles is essentially the same as dimension "s" in the first BE mask section. In one aspect, a column of opaque rectangles is overlaid on a first WL in the semiconductor substrate and a second column of opaque rectangles is overlaid on a second WL parallel to the first WL. During the MTJ patterning sequence, a dummy MTJ having a first area size may be formed above each dummy BE with a second area size where the second area size is substantially greater than the first area size.

The BE mask may be fabricated by a conventional method that involves patterning a continuous opaque film such as chrome on a clear quartz substrate.

After the BE ILD is deposited on the etch stop ILD to fill openings between BE elements, a second patterning and etch sequence is performed as described previously to simultaneously form dummy MTJ devices above a certain number of dummy BE elements and active MTJ elements above active BE elements. Thereafter, a MTJ ILD layer is deposited on the dummy MTJ arrays and active MTJ arrays and is followed by a CMP process that stops on the hard mask layer. Next, a second etch stop layer and a BIT ILD layer are sequentially deposited on the MTJ ILD and hard mask. A third patterning and etch sequence is employed to form trenches in the BIT ILD which stop on the second etch stop layer. Then another patterning and etch process is used to form vias in the aforementioned trenches that extend through the underlying MTJ ILD and etch stop ILD to uncover portions of the WL pad and WLC layer. The trenches and vias are filled with a metal such as Cu to form interconnects between the BIT line metal in the trenches and the WL pads and WLC. The final step in the process flow involves a third CMP step to planarize the BIL line and the BIT ILD layer. As a result of the improved BE layout, delamination of the etch stop ILD is minimized and improved planarization of the BE ILD is achieved because of the additional dummy BE features that enable more uniform etching across the wafer.

BRIEF DESCRIPTION OF THE DRAWINGS

FIG. 1b is a top-down view of an active device area and open field areas including bonding pad regions in FIG. 1a.

DETAILED DESCRIPTION OF THE INVENTION

The present invention is a novel BE layout (mask) used to pattern a BE layer formed in a MRAM device. The present invention also encompasses a MRAM structure and a method for forming the same that minimizes delamination of interlevel dielectric (ILD) layers formed between a word line (WL) layer and a bit line (BIT) layer, improves ILD layer thickness uniformity, and reduces pinholes in an etch stop ILD layer that can lead to WL corrosion. Although the exemplary embodiment depicts a MRAM device with a 1T1MTJ architecture, the present invention may also apply to other magnetic memory devices known in the art that include a BE layer and an array of MTJ devices. Drawings are provided by way of example and are not intended to limit the scope of the invention. The MTJ devices may have a top spin valve, bottom spin valve, or multi-layer spin valve configuration as appreciated by those skilled in the art. Two layers are said to be coplanar when a top surface of each layer lies in the same plane.

Figure 1A:
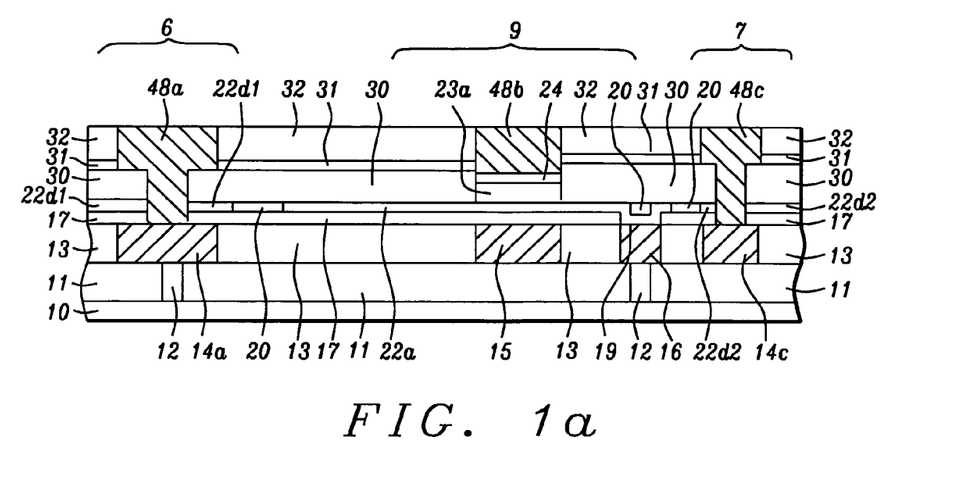
FIG. 1a is a cross-sectional view of a MRAM structure that shows a bottom electrode (BE) layer and a BE ILD layer formed between a MTJ and a word line (WL) according to one embodiment of the present invention.

Referring to FIG. 1a, the exemplary embodiment depicts a 1T1MTJ architecture wherein a bit line 48a-48c is the top conductor line in each MRAM cell and a bottom electrode (BE) 22a is a patterned conductor pad connected to an underlying selection transistor (not shown). Word line 15 is separated by ILD layers 11, 17 from other conductive elements and is aligned below a BE 22a and a MTJ 23a. The cross-sectional view illustrates only one MRAM cell in a device area (block) 9 that includes 4 million cells in a 4 Mb MRAM and 16 million devices in a 16 Mb MRAM, for example. There are also open field regions (not shown) between device blocks that do not contain active devices.

A method of forming a MRAM structure similar to that depicted in FIG. 1a was previously disclosed by the inventors in U.S. Pat. No. 7,122,386 and is herein incorporated by reference in its entirety. In view of issues related to an etch stop ILD layer contacting the word line such as ILD peeling during subsequent CMP processes and corrosion in word line and word line pads caused by pinholes in the thin etch stop ILD layer, we were motivated to further improve the MRAM structure by modifying the BE layer pattern (layout) by adding dummy BE elements to provide additional coverage of etch stop ILD layer for increased protection and reliability. The improved MRAM structure shown in FIG. 1a having etch stop ILD layer 17, WL 15, and WLP 14 will be described in detail and then a description of the BE mask comprised of a novel BE layout that is employed to pattern the BE layer and form BE elements including active BE elements 22a and dummy BE elements 22d1, 22d2 will be provided in a later section.

Substructure 10 is comprised of metal layers, insulating layers, transistors, and other devices not shown in order to simplify the drawing. There is a first ILD layer 11 formed on the substructure 10. In one embodiment, the first ILD layer 11 is made of fluorosilicate glass (FSG) and is disposed on a substructure 10 that has an exposed third metal level (M3) formed therein. There are vias (V3) 12 formed in the first ILD layer 11 that connect the M3 layer to overlying WL pads 14a, 14c and to word line contact (WLC) 16. According to one embodiment, a WL ILD layer 13 is deposited on the first ILD layer 11 and vias 12. The WL ILD layer 13 and subsequent ILD layers described herein may be comprised of silicon oxide or another insulator such as a low k dielectric material used in the art. Elements 10-13 are fabricated by standard processes that are not described herein. Likewise, a conventional patterning, etching, metal deposition, and planarization sequence may be employed to form WL pads (WLP) 14a, 14c, WL 15, and WLC 16 in the ILD layer 13. Typically, the word line metal is Cu and a CMP process is needed to make the WLP 14a, 14c, WL 15, and WLC 16 coplanar with the WL ILD layer 13.

Figure 1B:
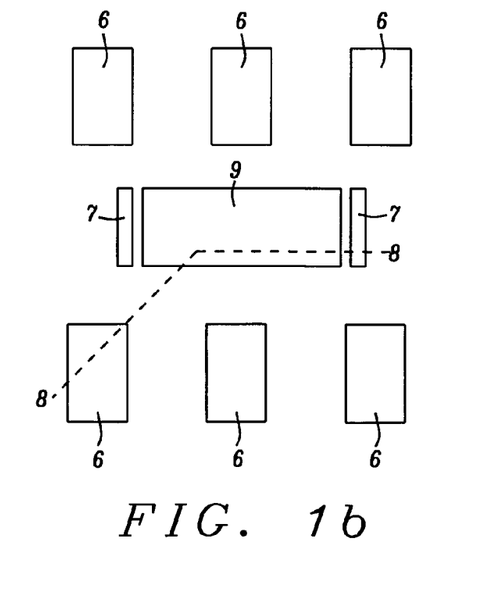

Referring to FIG. 1b, a top-down view of the layout depicted in FIG. 1a is provided. Note that the cross-sectional view in FIG. 1a may be obtained along the plane 8-8. In the exemplary embodiment, active device area (block) 9 has a rectangular shape. When all levels are removed above the WL metal layer, active device area 9 comprises a plurality of word lines 15, and adjacent regions 6 and 7 include a plurality of WL pads 14a and 14c, respectively. In FIG. 1a, WL pad 14a is formed in a bonding pad region 6 of the device where WL pad 14a is connected to an overlying BIT line 48a for probing the device to obtain electrical measurements. A second type of WL pad 14c in region 7 becomes connected in the final device to an active BIT line 48c in an open field area. As appreciated by those skilled in the art, other designs comprising a plurality of WL pads arranged around an active device area may be employed to replace the one depicted in FIG. 1b.

An ILD layer 17 that also serves as an etch stop layer and is preferably silicon nitride ($SiN_x$) is deposited on the WL ILD layer 13, WLP 14a, 14c, WL 15, and WLC 16 by a chemical vapor deposition (CVD), physical vapor deposition (PVD), or the like. Alternatively, the ILD layer 17 may be silicon oxynitride or another etch stop material known to those skilled in the art. The ILD layer 17 is typically thin with a 100 to 300 Angstrom thickness. A standard photoresist patterning and etch sequence is used to form an opening 19 in ILD layer 17 to expose the WLC 16 in each MRAM cell.

In one embodiment, a BE layer is deposited on the ILD layer 17 and is patterned to form BE elements 22a and dummy BE elements 22d1, 22d2 prior to depositing a MTJ stack of layers and forming MTJ elements. Preferably, a sputter deposition system such as an Anelva 7100 system is used to deposit the BE layer. The present invention encompasses a variety of materials and configurations for the BE layer. In one aspect, the BE layer may be comprised of a plurality of layers including metals, metal alloys, and metal nitrides such as TaN. A photolithography process comprising a BE mask according to the present invention is preferably used to pattern the BE layer to form BE elements 22a and dummy BE elements 22d1, 22d2. The BE patterning step involves coating a photoresist layer (not shown) on the BE layer and then patternwise exposing the photoresist layer through the BE layout on the BE mask. Regions of the photoresist layer that are exposed through clear regions in the BE mask are then developed away with an aqueous base solution. Thus, the BE layout on the BE mask is transferred into the photoresist film as a BE pattern. In the following step, a RIE process transfers the openings in the photoresist pattern through underlying regions in the BE layer and stops on ILD layer 17. The remaining photoresist film is removed to leave a plurality of BE elements 22a as well as a plurality of dummy BE elements 22d1, 22d2. A more detailed description of the BE elements 22a, 22d1, 22d2 will be provided in a later section.

Figure 2:
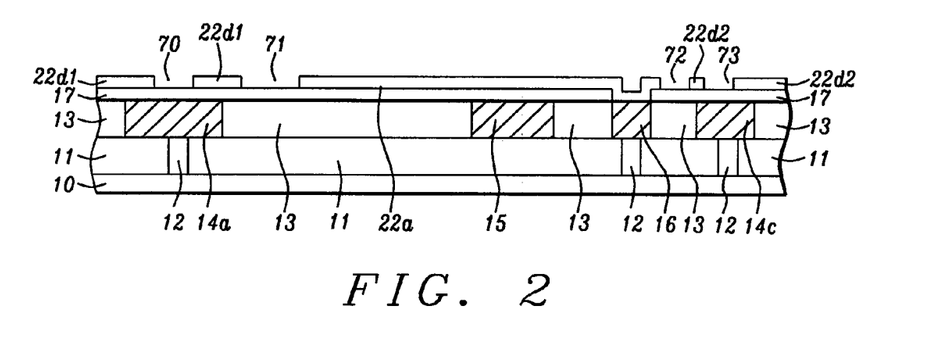
FIGS. 2 and 3 are intermediate steps in forming the MRAM structure in FIG. 1a according to one embodiment of the present invention.

Referring to FIG. 2, the patterned BE layer comprises a via opening 70 in dummy BE element 22d1 above WLP 14a, openings 71, 72 which separate BE element 22a from dummy BE elements 22d1, 22d2, and a via opening 73 in dummy BE element 22d2 above WLP 14c. The dummy BE elements 22d1, 22d2 are advantageously used to allow a more uniform RIE etch across the substrate during subsequent planarization of a BE ILD layer. It should be understood that there are a plurality of vias 70, 73 and a plurality of openings 71, 72 but only one of each is depicted in the cross-sectional view to simplify the drawing.

Figure 3:
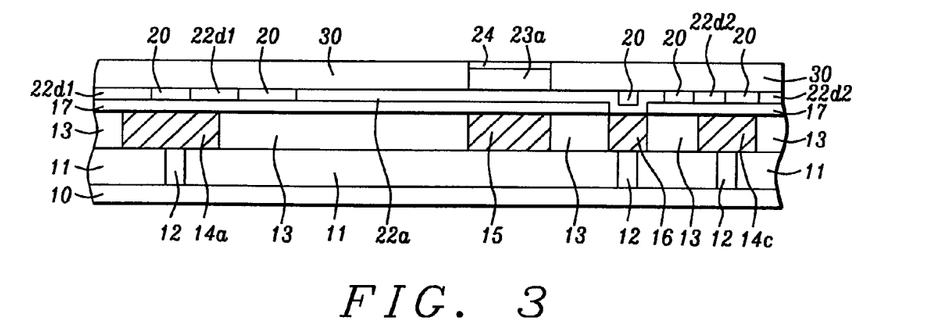

Referring to FIG. 3, a BE ILD layer 20 is deposited to fill the openings 70-73 and cover the BE elements 22a, 22d1, 22d2. In one embodiment, a two step planarization process is used to achieve coplanarity of the BE ILD layer 20 and BE elements 22a, 22d1, 22d2. First, a CMP step removes a substantial portion of the BE ILD layer above BE elements 22a, 22d1, 22d2. Then a RIE removes the remaining BE ILD layer and stops on the top surfaces of BE elements 22a, 22d1, 22d2. In an alternative embodiment, the CMP step is employed to perform the complete planarization process and the RIE step is omitted. The presence of BE dummy elements 22d1, 22d2 fill a majority of open space between adjoining device blocks of BE elements 22a thereby enabling a more uniform BE ILD 20 thickness and also serve to cover ILD layer 17 in spaces between BE elements 22a to prevent RIE or CMP processes from thinning or delaminating the ILD 17 in these regions. As a result, pinholes in the ILD layer 17 that could allow chemical etchants to attack underlying WLP 14a, 14c in prior art designs are greatly reduced because of the new BE layout. Previously, we have practiced a method with no dummy BE elements in the device area (FIG. 4a) which leads to non-uniform RIE etching of a BE ILD layer since large open areas containing no BE metal are etched at a faster rate than small spaces between adjacent BE elements.

In the next step of MRAM fabrication, a MTJ stack of layers and overlying hardmask are deposited on the BE ILD 20 and BE elements 22a, 22d1, 22d2 by a sputter deposition process. In one embodiment, the hard mask 24 is a Ta layer having a thickness of about 200 to 1500 Angstroms. Optionally, a hard mask spacer may be inserted between the uppermost MTJ layer and the hard mask 24 to assist with a subsequent etching process. The MTJ stack of layers and hardmask are patterned by a process similar to the BE patterning process except that a different mask comprising a unique MTJ layout such as the design disclosed in related patent application Ser. No. 11/724,435 is preferably used. An active MTJ element 23a with overlying hardmask 24 is formed above a WL 15 in each MRAM cell. Dummy MTJ elements are typically included in the MTJ layout to assist in improving CMP uniformity but are not shown in this drawing. A MTJ ILD layer 30 is then deposited on the hard mask 24 and on exposed regions of BE 22a, 22d1, 22d2 and on BE ILD 20. A CMP process may be employed to make the MTJ ILD layer 30 coplanar with hard mask 24.

The present invention also anticipates alternative methods of patterning the MTJ and BE elements. For example, as described in patent application Ser. No. 11/724,435, the BE layer, MTJ stack, and hard mask may be sequentially laid down before the MTJ and hard mask are patterned. Thereafter, the BE layer may be patterned to form BE elements. The BE mask layout disclosed herein could also be implemented in this alternative fabrication scheme. However, those skilled in the art will appreciate that the fabrication method will be altered somewhat to align the BE mask to the MTJ pattern instead of aligning to the underlying WL pattern as in the exemplary embodiment.

Returning to FIG. 1a, a second etch stop layer 31 and BIT ILD layer 32 are sequentially formed by conventional methods on the MTJ ILD layer 30 and hard mask 24. The second etch stop layer 31 is formed by a CVD or PVD method, for example, and may be comprised of SiNx or the like. The thickness of the second etch stop layer 31 may be in the range of 100 to 500 Angstroms. Thereafter, a BIT line ILD layer hereafter referred to as BIT ILD layer 32 having a thickness of about 1000 to 10000 Angstroms is deposited on the second etch stop layer 31. The BIT ILD layer 32 may have the same composition as the dielectric material in the MTJ ILD layer 30, BE ILD layer 20, and in WL ILD layer 13.

A dual damascene process is then performed in which a first patterning and etch sequence is used to form trenches in the BIT ILD layer 32 that uncover portions of the MTJ ILD layer 30. A second photoresist patterning and etch sequence is followed to form vias also known as contact holes below the trench openings and through the MTJ ILD layer 30, and ILD layer 17 below vias 70, 73 thereby uncovering portions of the WLP 14a, 14c below the vias and trench openings. Once the second photoresist layer is removed, the vias and trenches are filled with metal such as Cu. Thus, a bit line contact 48a is formed that connects to WLP 14a, and a bit line contact 48c is formed that contacts WLP 14c. In addition, bit line 48b is formed on hard mask 24 above MTJ 23a and WL 15. A CMP process is performed to achieve planarization of BIT 48b with BIT contacts 48a, 48c.

According to the present invention, the BE layout comprises at least four distinct mask sections that may be referred to as (1) an active device area which will be used to form active BE elements in MRAM cells, (2) a bond pads area, (3) an open field area that will be aligned above a region in the substrate without WL metal under the etch stop ILD, and (4) an open field area that will be aligned over a region in the substrate with WL metal under the etch stop ILD. These four sections are repeated in a plurality of locations across the BE mask. The actual position and area occupied by each section on the BE mask varies with respect to the design of the MRAM array. Each of the BE layout sections may abut one or more of the other BE layout sections.

Figure 4A:
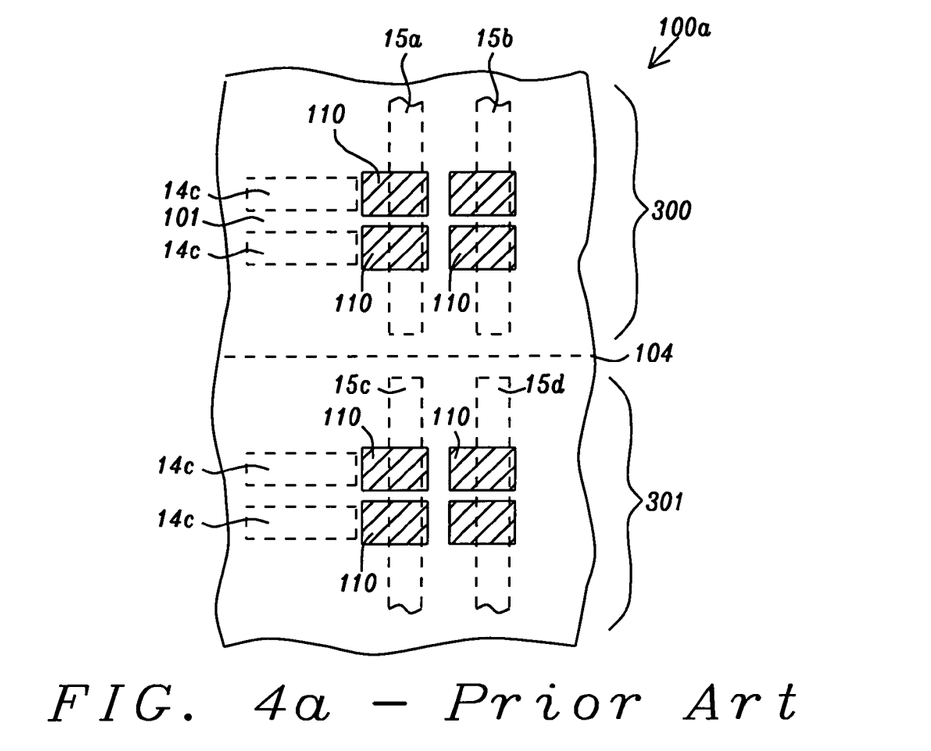
FIG. 4a is a top-down view of a prior art design for a device section of a BE layout that shows BE shapes in the mask overlaid on word lines (WL) in a device sub-layer.

Referring to FIG. 4a, a prior art BE design employed by the inventors includes a device area 100a having portions of two adjacent device blocks 300, 301 on the BE mask. Dashed line 104 denotes the boundary between device blocks 300, 301.

Opaque BE shapes 110 in device area 100a are superimposed over word lines 15a-15d and a plurality of WLP 14c in a substrate to indicate the alignment that is required when transferring the features on the BE mask including those in device area 100a into a photoresist layer coated on the substrate above WL 15a-15d and WLP 14c. Note that a stack comprised of a lower etch stop ILD layer, middle unpatterned BE layer, and upper photoresist layer are not shown above the WL 15a-15d and WLP 14c in order to simplify the drawing and emphasize the alignment of device area 100a to the word line metal layer. The regions 101 in device area 100a not covered by BE shapes 110 are clear quartz (mask substrate). There are no dummy BE shapes between BE shapes 110 in adjacent device blocks. It should be understood that there are 1 million BE shapes 110 in each device block 300, 301 in a 1 Mb MRAM device, for example.

Figure 4B:
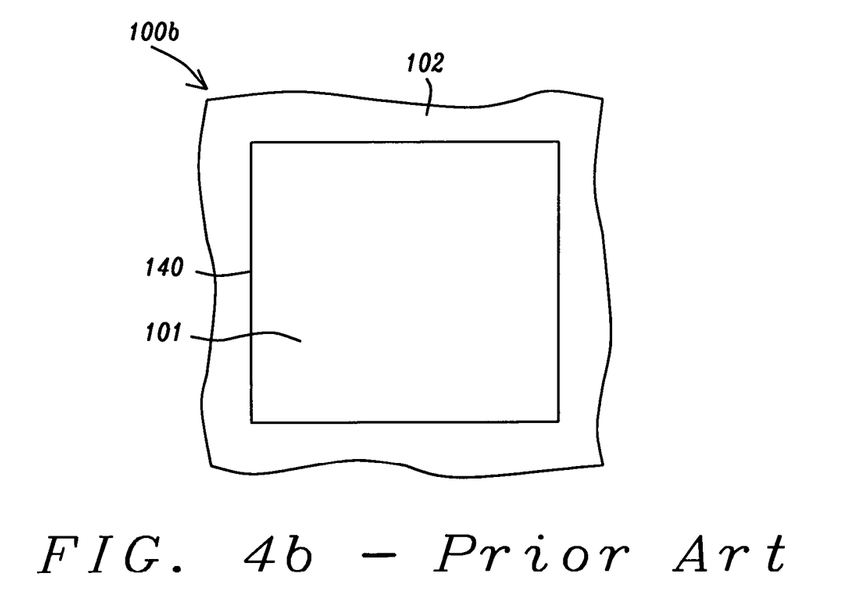
FIG. 4b is a top-down view of a prior art design for a bond pad section of a BE layout in which a clear mask region is used to expose a photoresist layer on a substrate and selectively expose certain portions of a BE layer to be removed in a subsequent etch.

In FIG. 4b, a portion of a prior art BE layout is shown that is a bond pads area 100b. There are no opaque features on this section of the BE mask. Therefore, in an embodiment where the boundary of the bond pads area is indicated by the shape 140, the region 101 inside the bond pads area is clear quartz. Optionally, shape 140 may be polygonal or another shape that conforms to the BE layout. The region 102 outside the bond pads area may have a combination of clear regions and opaque shapes (not shown). As a result, all of the photoresist layer on the substrate which is exposed through region 101 will be removed in the photoresist development process. During the subsequent etch process, all of the BE layer on the substrate which was uncovered by the removal of the photoresist layer during the patterning process will be removed to expose an underlying etch stop layer (not shown). This method can easily lead to defect issues as the etch process has a tendency to thin the large open regions of underlying etch stop ILD layer to yield pinholes and give a greater susceptibility to delamination which increases as ILD thickness decreases.

Figure 4C:
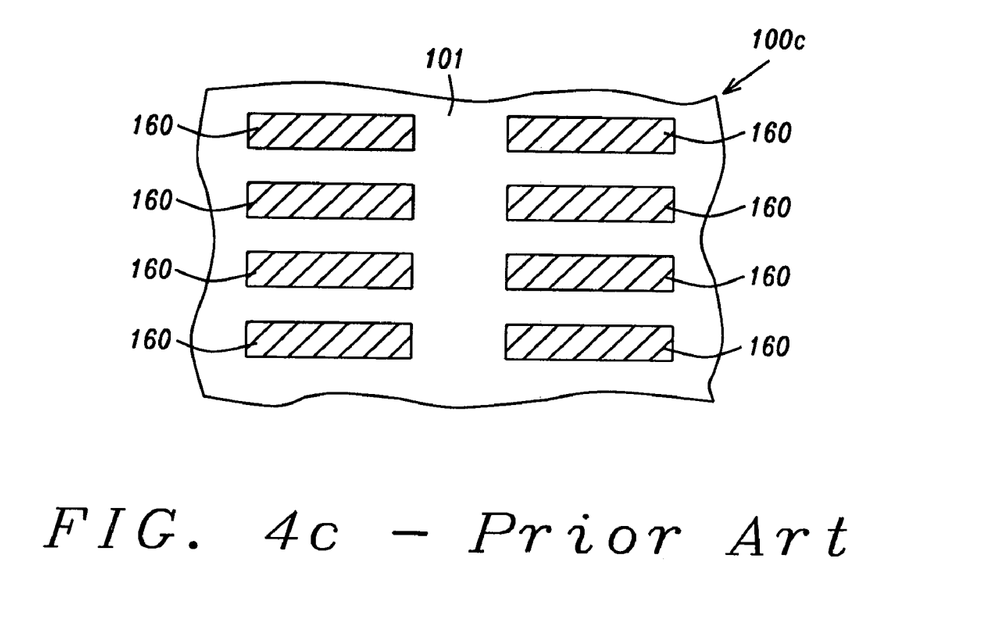
FIG. 4c is a top-down view of a prior art design for an open field area that shows BE dummy shapes on the mask overlaid on a portion of the device with no underlying WL.

Referring to FIG. 4c, an open field area 100c of a prior art BE layout that is not overlaid on a WL metal region in the substrate is depicted. Opaque BE dummy shapes 160 are formed on a clear quartz substrate 101 in the BE mask and may be formed in a plurality of rows and columns. Typically, the dummy BE elements 160 have the same shape and density as the overlying dummy MTJ elements that will be formed in a later step of the MRAM fabrication process using a MTJ mask.

Figure 4D:
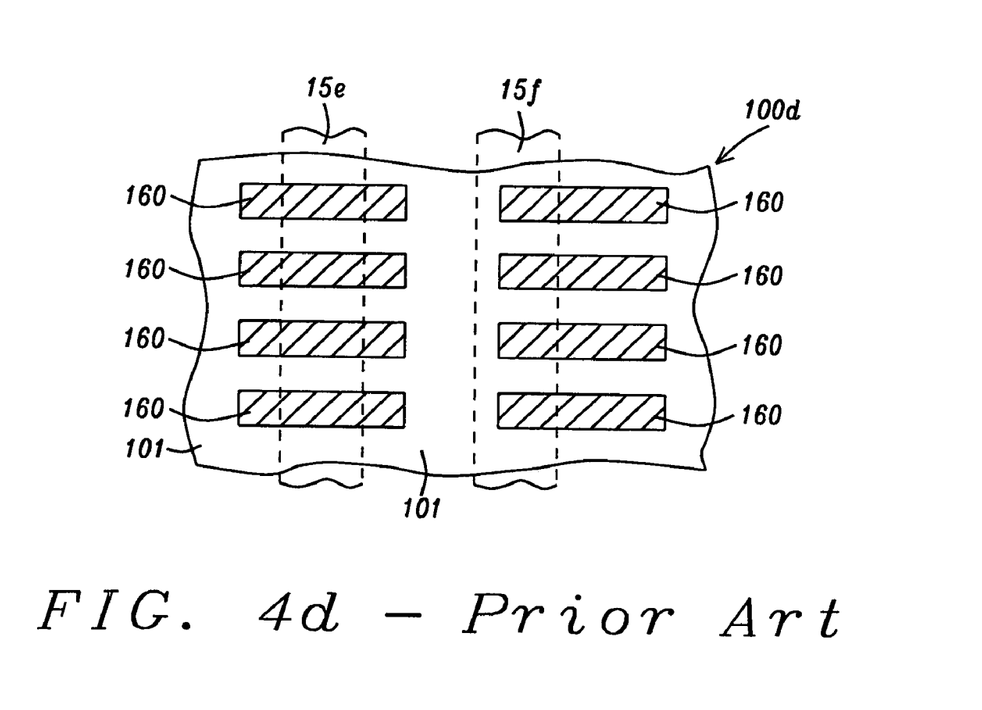
FIG. 4d is a top-down view of a prior art design for an open field area that shows BE dummy shapes on the mask overlaid on a portion of the device with underlying WL.

Referring to FIG. 4d, an open field area 100d of a prior art BE layout is overlaid on a portion of the substrate with word lines 15e, 15f formed therein. A plurality of opaque BE dummy shapes 160 is formed on a clear quartz substrate 101 and have a shape and density similar to the dummy BE shapes in open field area 100c.

According to the present invention, a new BE layout has been discovered that affords improved MRAM performance by minimizing defects arising from undesired thinning, delamination, and pinhole defect formation in the etch stop ILD layer. Three of the four BE layout sections mentioned previously with respect to FIGS. 4a-4d have been modified. Only the third section involving BE dummy shapes formed over a substrate region with no underlying WL metal remains essentially the same as in the prior art design.

Figure 5A:
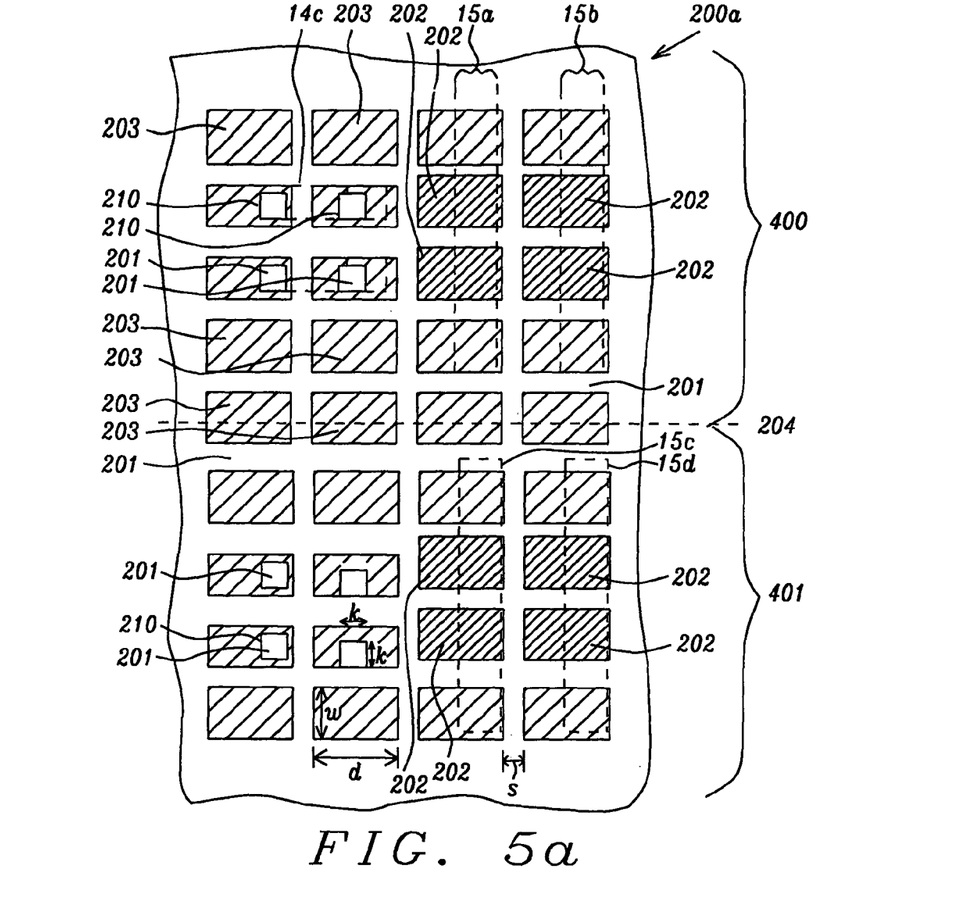
FIG. 5a is a top-down view of a device section of a BE layout according to the present invention in which regions between BE shapes in adjacent device blocks are substantially filled with dummy BE shapes and a plurality of dummy BE shapes have via openings formed therein.

Referring to FIG. 5a, one important feature of the present invention is the new BE layout section 200a for the device area which is depicted with two device block sections 400, 401 that are separated by dashed line 204. Only portions of two device blocks are shown to simplify the drawing. Each device block comprises a device region and open field regions between active devices. The actual number of device blocks depends on the type and size of MRAM cell to be fabricated. Unlike the prior art design that has no dummy BE features, layout section 200a comprises a plurality of dummy BE shapes 203 formed between BE shapes 202. In one embodiment, both the BE shapes 202 used to make active BE elements and the dummy BE shapes 203 have a rectangular shape with a length d and a width w that are generally less than 1 micron in size. Optionally, the BE features 202, 203 may have other shapes including polygons or circles as appreciated by those skilled in the art. It should be understood that the photoresist patterning process does not perfectly transfer a shape on the BE mask into the photoresist layer. Thus, a rectangular shape on the BE mask may print as an oval in the photoresist film. In general, sharp corners on mask features that are sub-micron in size become rounded corners in the imaged photoresist film. Moreover, most exposure systems involve a 4× or 5× reduction in image size which means a feature with a 1 micron dimension on the BE mask is transferred into the photoresist film as a feature with a 0.25 micron dimension for a 4× optical reduction process. Thus, any two sides of BE features 202, 203 that face each other are separated by a distance of about 0.5 to 1.0 microns for a 5× optical reduction mask design and a distance of about 0.4 to 0.8 microns for a 4× optical reduction mask design.

The space s which separates the long sides or short sides of any two adjacent BE features 202, 203 is preferably between 0.4 and 1.0 microns in order to print an actual space of 0.1 to 0.2 microns between adjacent BE 22a features in a MRAM device. In one embodiment, the space s is kept constant across the mask layout. The space s is sufficiently large to avoid two adjacent WL/BIT shorts in the final device (FIG. 1) even though there may be a defect related short between a BE element 22a and WL 15 through the etch stop ILD 17 in one MRAM cell. Note that BE shape 202 becomes BE element 22a and dummy BE shape 203 becomes BE dummy 22d1 in a MRAM cell in the final device. Alternatively, the dimension s may vary slightly across the BE layout section 200a. The important aspect is that the dummy BE features 203 are used to cover a majority of the clear quartz regions 201 between adjacent BE features 202 on BE layout 200a.

In yet another embodiment (not shown), a plurality of dummy BE features 203 may be joined together to form one larger BE dummy feature in BE layout section 200a. For example, four adjacent dummy BE features 203 arranged in a 2×2 array may be joined together to form one larger BE dummy feature having a length (2d+s) and a width (2w+s). Thus, there may be a plurality of dummy features 203 with size (w×d) in the same device block and one or more dummy features having a size [(2w+s)×(2d+s)]. Preferably, the distance between a side of the large dummy feature and a side of a smaller dummy feature 203 is the dimension s.

Note that the BE layout 200a is overlaid on the substrate such that each of the BE shapes 202 is aligned above one WL. In the exemplary embodiment, only WL 15a-15d are depicted but it should be understood that there is a plurality of WL in the substrate. Another important feature is that a plurality of dummy BE shapes 203 which are disposed above a WLP 14c have a via 210 formed therein. In one embodiment, each via 210 has a square shape with a dimension k where k<w and exposes a clear quartz region 201 in the BE mask. Optionally, other via shapes may be employed. The vias 210 enable an opening to be formed in the BE dummy elements in the partially completed MRAM cell so that a subsequent process step may be used to form a BIT contact to the WLP 14c through the opening 70 (FIG. 2).

Figure 5B:
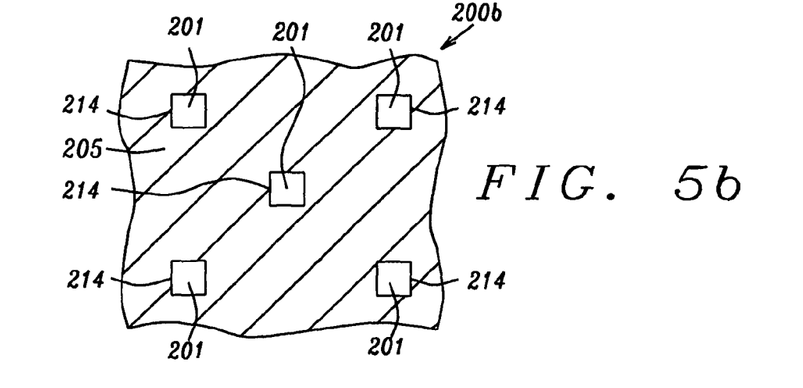
FIG. 5b is a top-down view of a bond pad section of a BE layout according to the present invention in which the mask is substantially opaque except for a plurality of via openings to enable connections to underlying WL pads in a sub-layer of the device.

Referring to FIG. 5b, a section 200b of the new BE layout is depicted that represents a bond pads area. Unlike a prior art design (FIG. 4b) that has no opaque features, the bond pads section disclosed herein has a majority of the clear quartz substrate covered by opaque material 205 such as chrome. There is a plurality of openings (vias 214) where the clear quartz substrate 201 is uncovered. The vias 214 are employed to eventually form openings in the BE layer which will be subsequently filled with metal to allow BIT contact 48c to connect with WLP 14c. As a result of BE pattern transfer into the BE layer, the opaque region 205 becomes unpatterned BE layer that remains in the device to protect underlying etch stop ILD layer 17 from delamination and exposure to etchants that could form pinholes. Incorporation of BE layout section 200b provides an extra measure of protection to etch stop ILD layer 17 to improve MRAM performance. Opaque region 205 becomes BE dummy element 22d2 when the BE layer is patterned during MRAM fabrication (FIG. 1).

Figure 5C:
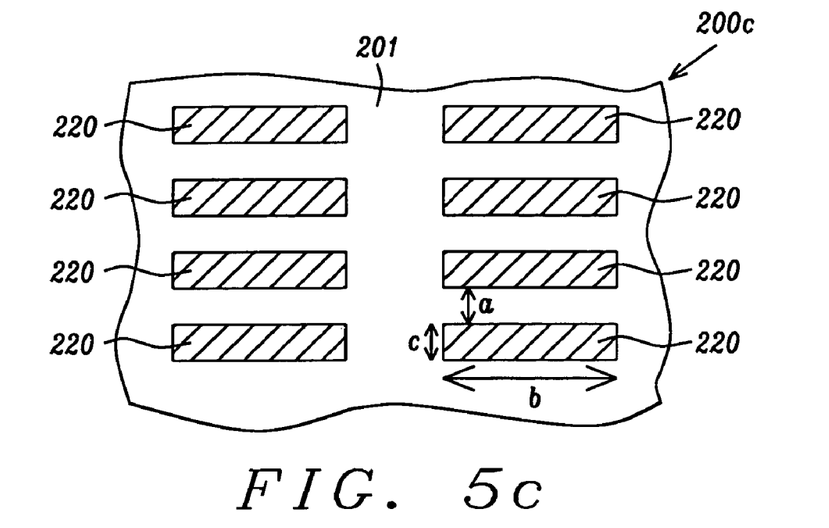
FIG. 5c is a top-down view of a open field area of a BE layout according to the present invention that shows BE dummy shapes on the mask overlaid on a portion of the device with no underlying WL.

Referring to FIG. 5c, the BE layout section 200c relates to a BE open field area without underlying WL metal in the MRAM cell. Similar to the design in FIG. 4c, there is a plurality of opaque features such as rectangular shapes 220 formed on a clear quartz substrate 201. In one embodiment, each of the rectangular opaque shapes 220 has a length b and a width c. Preferably, the distance a between adjacent shapes 220 is greater than c. In an alternative embodiment, $c \geq a$. The dummy BE shapes 220 will become dummy BE elements in the BE layer of the MRAM cell following pattern transfer. The density of dummy BE shapes 220 is kept essentially the same as the MTJ dummy density in a corresponding open field area section of the MTJ layout as appreciated by those skilled in the art.

Figure 5D:
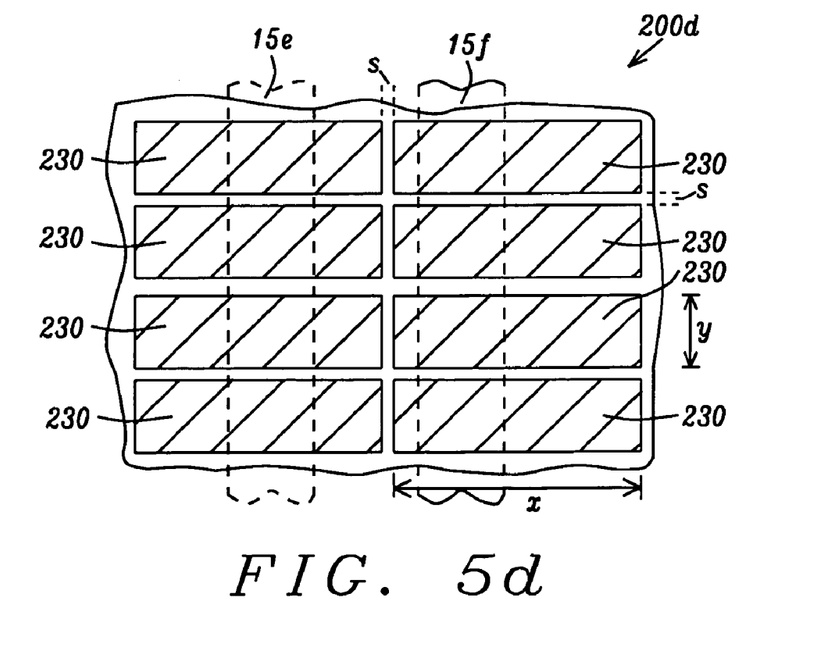
FIG. 5d is a top-down view of an open field area of a BE layout according to the present invention where BE dummy shapes are overlaid on a portion of the device with underlying WL and substantially fill the open field area except for small clear regions between adjacent BE dummy shapes.

In FIG. 5d, a BE layout section 200d is illustrated that relates to a BE open field area that is aligned above WL metal in a device during the BE patterning process. In the exemplary embodiment, there is a plurality of opaque dummy BE features 230 arranged in rows and columns, for example, that are aligned above a WL metal array including WL 15e, 15f. Each dummy BE shape 230 has a length x and a width y such that a substantial portion of clear quartz substrate 201 is covered by the opaque features. Preferably, the distance between two adjacent dummy BE features 230 is approximately the dimension s. Again, the addition of more opaque coverage on the BE mask in layout section 200d compared with dummy BE 160 density in FIG. 4d means that there will be more dummy BE coverage of etch stop ILD layer 17 in the final MRAM device according to the present invention. Dummy BE shapes 230 may have shapes other than rectangles and may be formed in arrays other than rows and columns.

It is important to increase the size of BE dummy features 230 in section 200d relative to BE dummy features 220 in section 200c since an etch stop ILD layer is subject to additional strain in regions above or proximate to WL metal. For example, thermal expansion and contraction from WL metal places additional stress on an overlying etch stop ILD layer that can lead to delamination in prior art designs. However, according to the present invention, etch stop ILD layer 17 is covered by dummy BE elements (not shown) fabricated from dummy BE shapes 230 that provide additional support and protection from strain in open areas near WL metal.

Figure 6:
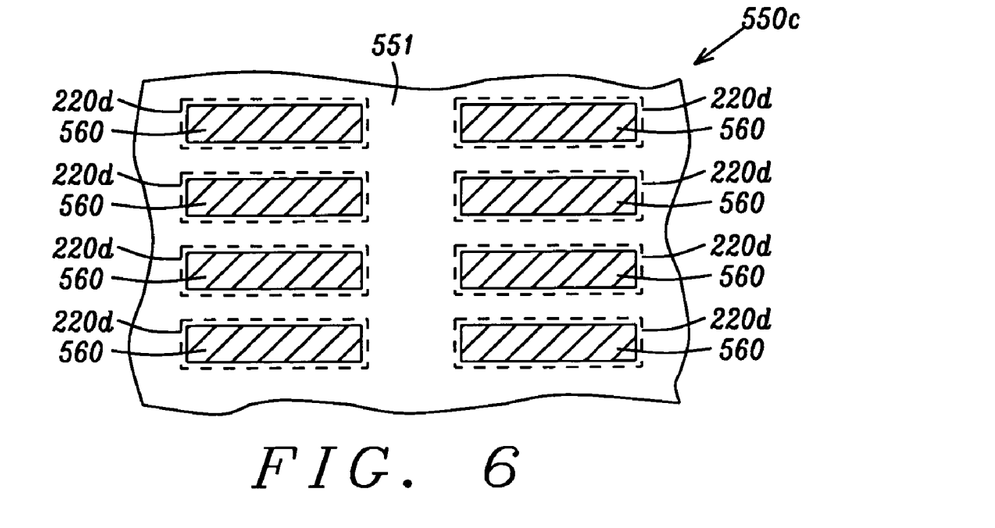
FIG. 6 is a top-down view of an open field area of a MTJ layout that illustrates one embodiment where a MTJ dummy shape is overlaid on a BE dummy shape.

Referring to FIG. 6, the overlay of opaque MTJ dummy shapes 560 on dummy BE features 220d formed in an open field area of in the BE layer in a MRAM device is depicted to show that the MTJ dummy density and shape may be similar to that in the underlying BE dummy elements 220d. Note that BE dummy elements 220d are formed as a result of the BE layer patterning process using BE layout section 220c with opaque BE dummy shapes 220. Although this drawing represents a MRAM fabrication sequence where the MTJ stack of layers is patterned after the BE layer is patterned, the present invention also encompasses a process flow where the BE layer is patterned following the formation of MTJ elements as mentioned previously. In the latter case, the BE layout 200c would be overlaid on the MTJ array but the density and shapes of the BE dummy features and MTJ dummy features would preferably remain the same.

Figure 7:
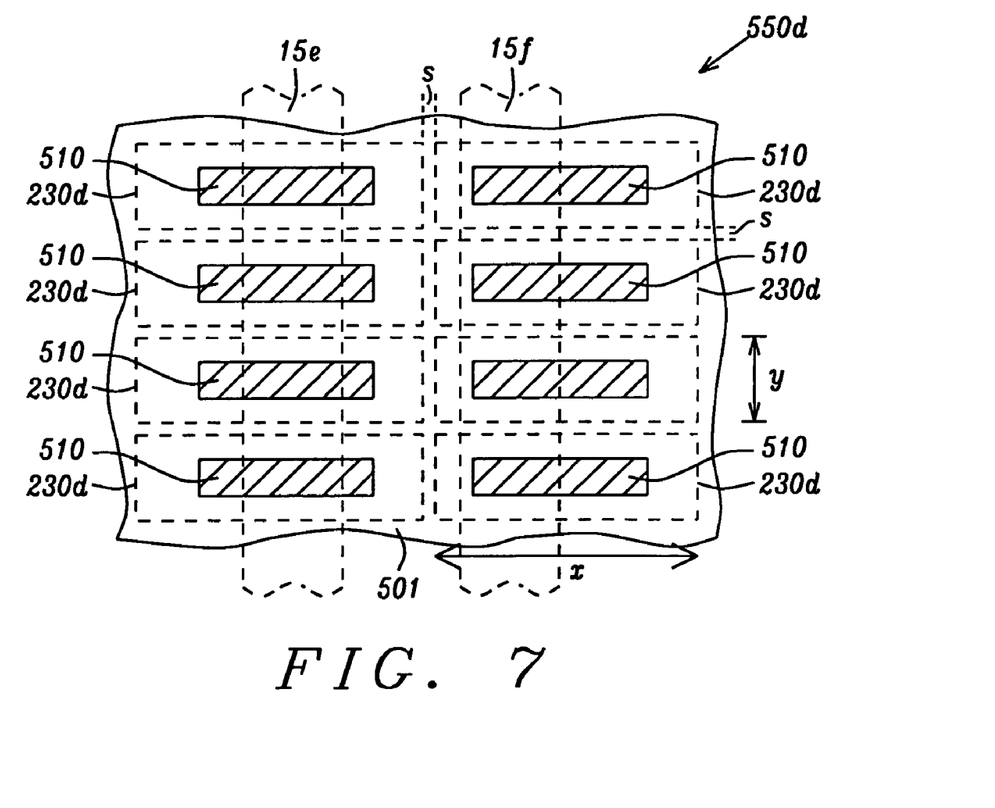
FIG. 7 is a top-down view of an open field area of a MTJ layout that shows one embodiment where MTJ dummy shapes in the MTJ mask are overlaid on WL and dummy BE shapes in the partially formed MRAM structure.

Referring to FIG. 7, the overlay of opaque MTJ dummy shapes 510 on dummy BE features 230d formed in an open field area in the BE layer with underlying WL metal is illustrated to show that the MTJ dummy density may be the same as the underlying BE dummy density 230d in this part of the MRAM device. BE dummy elements 230d are formed as a result of the BE layer patterning process using BE layout section 220d with opaque BE dummy shapes 230. However, the size of the MTJ dummy features 510 is preferably kept about the same as the size of the MTJ dummy features 560 in an open field area without underlying WL metal. Thus, the size of the BE dummy features 230d may be considerably larger than the size of overlying MTJ dummy features (not shown) resulting from patterning of the MTJ layer in open field areas with underlying WL metal.

By implementing the novel BE layout comprised of at least four separate sections as described herein, a significant improvement in etch stop ILD reliability and MRAM performance is realized. The additional dummy BE coverage of etch stop ILD layer proximate to underlying WL metal offers additional protection to minimize delamination of thin etch stop ILD layers. The dummy BE coverage allows etch stop ILD layers to be thinned to a greater extent than before without encountering device failure issues due to ILD peeling. Moreover, the additional dummy BE coverage in device areas enables a more uniform etch stop ILD layer across the substrate thereby minimizing defects such as pinholes that form when the etch stop ILD layer is thinned uncontrollably from etching processes in large open areas. Overall improvement in reliability and performance is expected to allow a higher density MRAM device to be fabricated to meet the demands of advanced technologies.

While this invention has been particularly shown and described with reference to, the preferred embodiment thereof, it will be understood by those skilled in the art that various changes in form and details may be made without departing from the spirit and scope of this invention.

We claim:

1. A BE layout (mask) for a memory device with an array of opaque features formed in a plurality of device blocks on a clear mask substrate, comprising:

(a) a device section which comprises a plurality of opaque BE shapes that are used to form active BE elements in the memory device, and a plurality of opaque dummy BE shapes that are used to form dummy BE elements in the memory device, said opaque BE shapes in adjacent device blocks have clear substrate regions formed therebetween that are substantially covered by said opaque dummy BE shapes and a certain number of opaque dummy BE shapes have openings formed therein that expose regions of clear substrate to allow alignment to WL pads in a device substrate;

(b) a bond pads section comprised of an opaque film with a plurality of openings formed therein, said openings expose regions of the clear substrate to allow alignment to bonding pad regions in a device substrate;

(c) a first open field section having an array of opaque dummy BE features with a first area size formed on the clear mask substrate; and (d) a second open field section having an array of opaque dummy BE features with a second area size that cover a substantial portion of the clear mask substrate wherein adjacent dummy BE features are separated by a space of clear mask substrate having a certain dimension, and said second area size is greater than said first area size.

2. The BE layout of claim 1 wherein each of the opaque BE shapes and opaque dummy BE shapes are rectangular and have an equivalent length and width.

3. The BE layout of claim 1 wherein the opaque BE shapes and opaque dummy BE shapes are arrayed in rows and columns, each of the opaque BE shapes and opaque dummy BE shapes has a side that faces a side of an adjacent opaque BE shape or opaque dummy BE shape and any two sides that face each other are separated by a distance of about 0.5 to 1.0 microns for a 5× optical reduction mask design and a distance of about 0.4 to 0.8 microns for a 4× optical reduction mask design.

4. The BE layout of claim 3 wherein the distance between any two sides of adjacent opaque BE shapes, the distance between any two sides of adjacent opaque dummy BE shapes, and the distance between the side of an opaque BE shape and a side of an adjacent opaque dummy BE shape in the device section is essentially equivalent to the certain dimension of clear space between adjacent opaque dummy BE features having a second area size in the second open field section.

5. The BE layout of claim 1 wherein the opaque dummy BE shapes in the first open field section and in the second open field section have a rectangular shape and are arrayed in rows and columns.

6. A MRAM structure with a plurality of device blocks wherein each device block includes device regions and open field regions between adjacent device regions, comprising:
(a) a word line metal layer formed on a substructure, said word line metal layer includes a word line pad (WLP) and a word line (WL);
(b) a word line interlevel dielectric (ILD) layer formed coplanar with said WL and WLP and having a bonding pad region on a top surface thereof;
(c) an etch stop ILD layer formed on the WLP, WL, and word line ILD layer;
(d) a bottom electrode (BE) layer formed on and contacting the etch stop ILD layer, said BE layer includes a plurality of active BE elements in the device region with an active BE element above each WL, a plurality of first dummy BE elements in the device region with an opening formed in a first dummy BE above each WLP, a plurality of second dummy BE elements formed in the open field regions, and a BE dummy element with an opening formed therein above each bonding pad region;
(e) a MTJ layer with a hard mask formed thereon that includes a MTJ element contacting the active BE element above each WL;
(f) a MTJ ILD layer formed on the BE layer and coplanar with said hard mask on the MTJ layer; and
(g) a bit line metal layer formed on the MTJ ILD and comprising a bit line (BIT) formed above the MTJ, a first bit line contact that connects with the WLP through the opening in the first dummy BE element, and a second bit line contact which connects to the bonding pad region through an opening in the dummy BE element above said bonding pad region.

7. The MRAM structure of claim 6 wherein the BE layer covers a substantial portion of the etch stop ILD layer in bonding pad regions, in open field regions with underlying word line metal layer, and in device regions.

8. The MRAM structure of claim 6 wherein the MTJ layer is further comprised of a plurality of dummy MTJ elements in the open field regions that have essentially the same density as the second dummy BE elements in the open field regions, said dummy MTJ elements are overlaid on the second dummy BE elements in the open field regions.

9. The MRAM structure of claim 6 wherein the plurality of active BE elements and the plurality of first dummy BE elements in the active device region have the same size and shape and cover a substantial portion of the underlying etch stop ILD layer.

10. The MRAM structure of claim 6 wherein the plurality of second dummy BE elements is comprised of a plurality of dummy BE elements having a first area size that are not formed above the word line metal layer and a plurality of dummy BE elements having a second area size substantially greater than the first area size which are formed above the word line metal layer.

11. A method of forming a MRAM structure with a plurality of device blocks wherein each device block includes device regions, and open field regions between adjacent device regions, comprising:
(a) providing a word line metal layer and a coplanar word line ILD layer formed on a substructure, said word line metal layer includes a word line pad (WLP) and a word line (WL);
(b) forming an etch stop ILD layer on the WLP, WL, and word line ILD layer;
(c) forming a bottom electrode (BE) layer on the etch stop ILD layer, said BE layer includes a plurality of active BE elements in the device regions with an active BE element above each WL, a plurality of first dummy BE elements in the device regions with an opening formed in a first dummy BE above each WLP, a plurality of second dummy BE elements formed in the open field regions, and a BE dummy element with an opening formed therein above each bonding pad region;
(d) forming a MTJ layer with a hard mask disposed thereon that includes a MTJ element contacting the active BE element above each WL;
(f) forming a MTJ ILD layer on the BE layer and coplanar with said hard mask on the MTJ layer; and
(g) forming a bit line metal layer on the MTJ ILD and comprising a bit line (BIT) formed above each MTJ, a first bit line contact that connects with the WLP through the opening in the first dummy BE element, and a second bit line contact which connects to the bonding pad region through an opening in the dummy BE element above the bonding pad region.

12. The method of claim 11 wherein the BE layer covers a substantial portion of the etch stop ILD layer in bonding pad regions, in open field regions with an underlying word line metal layer, and in device regions.

13. The method of claim 11 wherein the etch stop ILD layer is comprised of $SiN_x$ and has a thickness between about 100 and 300 Angstroms.

14. The method of claim 11 wherein the plurality of active BE elements and the plurality of first dummy BE elements in the active device region have the same size and shape and cover a substantial portion of the underlying etch stop ILD layer.

15. The method of claim 14 wherein the plurality of active BE elements and the plurality of first dummy BE elements have a rectangular shape and the distance between two adjacent active BE elements, the distance between two adjacent first dummy BE elements, and the distance between an active BE element and an adjacent first dummy BE element is about 0.1 to 0.2 microns.

16. The method of claim 11 wherein the MTJ layer is further comprised of a plurality of dummy MTJ elements in the open field regions that have essentially the same density as the second dummy BE elements in the open field regions, said dummy MTJ elements are overlaid on the second dummy BE elements in the open field regions.

17. The method of claim 11 wherein the plurality of second dummy BE elements is comprised of a plurality of dummy BE elements having a first area size that are not formed above the word line metal layer and a plurality of dummy BE elements having a second area size substantially greater than the first area size which are formed above the word line metal layer.

18. The method of claim 17 wherein the dummy BE elements having a second area size cover essentially all of the underlying etch stop ILD layer except for small spaces between adjacent dummy BE elements wherein the adjacent dummy elements are separated by a distance that is essentially the same distance as that between adjacent active BE elements in the device region.

19. The method of claim 11 wherein the active BE elements are separated from the plurality of first dummy BE elements and the plurality of second dummy BE elements by a BE ILD layer that is coplanar with the BE layer.

20. The method of claim 11 wherein the BE layer is comprised of a plurality of layers including metals, metal alloys, and metal nitrides.

* * * * *